(12) United States Patent
Chen et al.

(10) Patent No.: US 8,760,238 B2
(45) Date of Patent: Jun. 24, 2014

(54) EQUALIZER FOR LOSS-COMPENSATION OF HIGH-FREQUENCY SIGNALS GENERATED IN TRANSMISSION CHANNELS

(71) Applicant: Hon Hai Precision Industry Co., Ltd., New Taipei (TW)

(72) Inventors: Chien-Hsun Chen, New Taipei (TW); Po-Chuan Hsieh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/726,259

(22) Filed: Dec. 24, 2012

(65) Prior Publication Data

US 2013/0342290 A1 Dec. 26, 2013

(51) Int. Cl.
  *H04B 3/14* (2006.01)
(52) U.S. Cl.
  CPC .................................... *H04B 3/14* (2013.01)
  USPC ........................................................ 333/28 R
(58) Field of Classification Search
  USPC ..................................................... 333/28 R
  See application file for complete search history.

(56) References Cited

U.S. PATENT DOCUMENTS

| | | | |
|---|---|---|---|
| 7,457,132 B2* | 11/2008 | Gisin et al. ..................... | 361/782 |
| 2012/0194304 A1* | 8/2012 | Muraoka ...................... | 333/28 R |
| 2013/0272363 A1* | 10/2013 | Hsieh et al. .................... | 375/229 |

* cited by examiner

*Primary Examiner* — Stephen Jones
(74) *Attorney, Agent, or Firm* — Novak Druce Connolly Bove + Quigg LLP

(57) ABSTRACT

An equalizer for compensating transmission losses of electronic communication signals includes a circuit board and a compensation module. The compensation module includes a pair of input pins, a pair of output pins, first and second resistors, first and second vias, and a pair of micro-strips. When a signal transmitted by the circuit board is received by the input pins, a first part of the signal is directly outputted from the output pins, a second part of the signal is reflected by the first resistor and transmitted back to the output pins to be outputted, and a third part of the signal is reflected by the second resistor and transmitted back to the output pins to be outputted, such that the output of the equalizer applies two stages of compensation.

6 Claims, 6 Drawing Sheets

EQUALIZER FOR LOSS-COMPENSATION OF HIGH-FREQUENCY SIGNALS GENERATED IN TRANSMISSION CHANNELS

BACKGROUND

1. Technical Field

The present disclosure relates to equalizers used in electronic communication, and particularly to an equalizer providing better signal loss-compensation.

2. Description of Related Art

In electronic communications, high-frequency signals may be attenuated during transmission, this attenuation may lead to transmission loss. The transmission loss of high-frequency signals may result in data loss. Equalizers may be used to compensate for the attenuation of high-frequency signals. However, equalizers are expensive and for extended transmission distances, equalizers may be cost-prohibitive.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the various figures.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
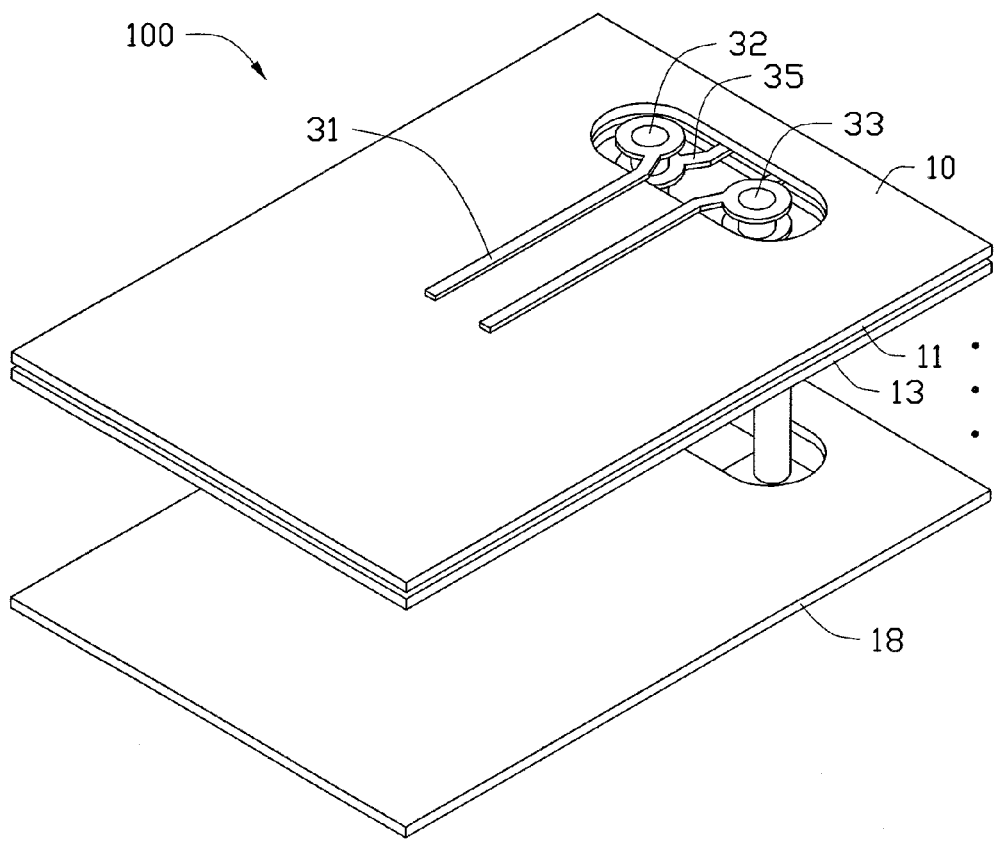
FIG. 1 is a schematic view of an equalizer, according to an exemplary embodiment.
Figure 2:
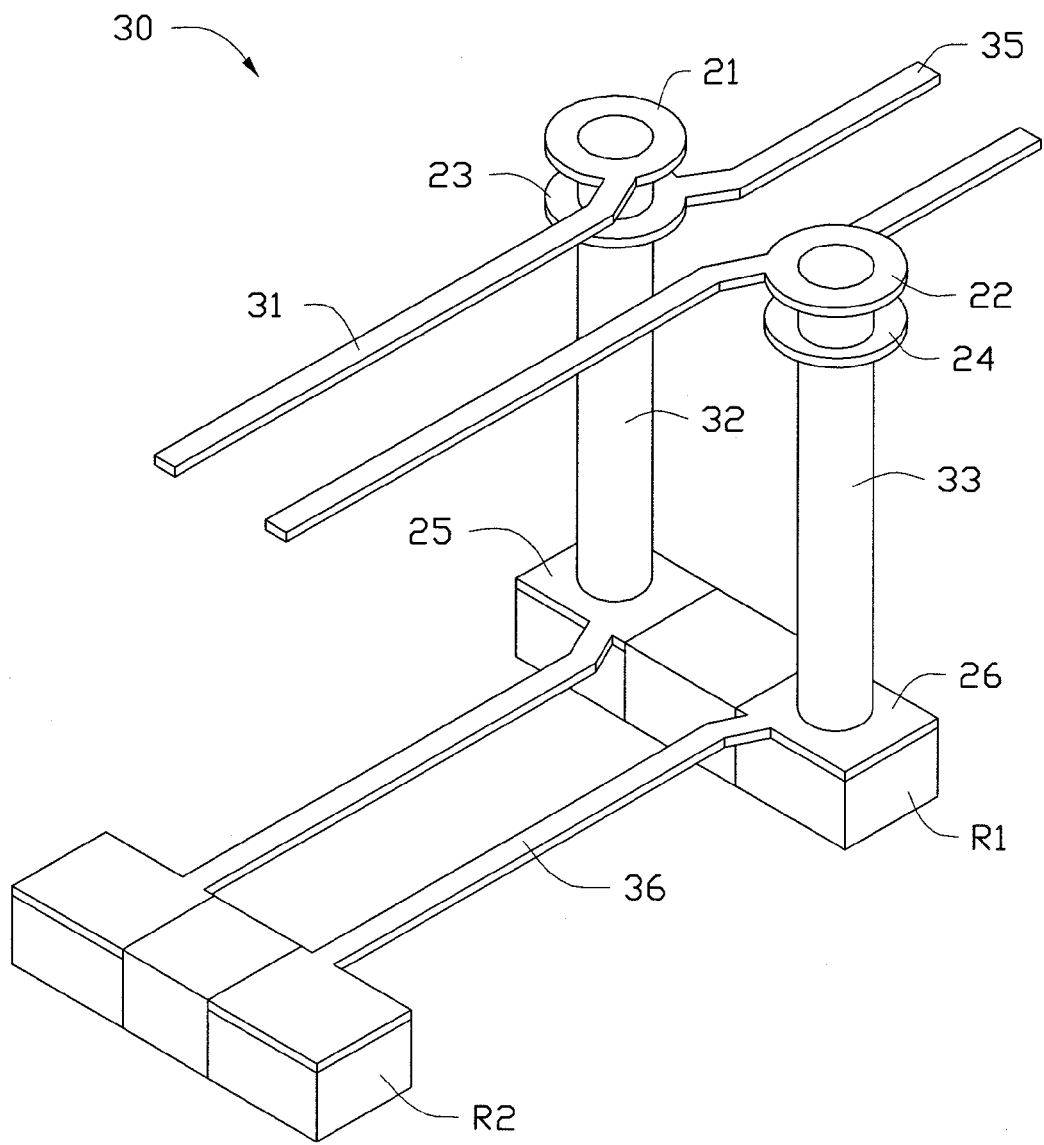
FIG. 2 is a schematic view of a compensation module of the equalizer shown in FIG. 1.

FIGS. 1 and 2 are schematic views of an equalizer 100, according to an exemplary embodiment. The equalizer 100 can be used in an electronic device, for example, a personal computer (PC) or a mobile phone, to improve electronic communication quality. When high-frequency signals are transmitted in the electronic device, the equalizer 100 can compensate for attenuation of the high-frequency signals.

The equalizer 100 includes a circuit board 10 and a compensation module 30 mounted in the circuit board 10. In this embodiment, the circuit board 10 is a multilayer circuit board. In FIG. 1, only a top signal layer 11, a middle layer 13, and a bottom layer 18 of the circuit board 10 are shown.

The compensation module 30 includes a pair of input pins 31, a first via 32, a second via 33, a pair of output pins 35, a pair of micro-strips 36, a first resistor R1, and a second resistor R2.

The input pins 31, the first via 32, the second via 33, the output pins 35, and the micro-strips 36 are all made of conductive material, such as metal. The first via 32 and the second via 33 extend through the circuit board 10. The first via 32 is electrically connected to the top layer 11, the middle layer 13, and the bottom layer 18 through pads 21-23 respectively. The second via 33 is electrically connected to the top layer 11, the middle layer 13, and the bottom layer 18 through pads 24-26 respectively.

The input pins 31 are electrically connected to the pad 21 and the pad 22, respectively. In the embodiment, the input pins 31 are substantially planar sheets, and arranged on an outer surface of the top signal layer 11. The output pins 35 are electrically connected to the pad 23 and the pad 24, respectively. In the embodiment, the output pins 35 are substantially planar sheets, and arranged on a surface of the middle layer 13.

The micro-strips 36 are respectively connected to the pads 25 and 26 with first ends. The pads 25 and 26 are respectively connected to two terminals of the resistor R1. Second ends of the pair of micro strips 36 are respectively connected to two terminals of the resistor R2. The resistors R1 and R2 are arranged on an outer surface of the bottom layer 18.

In use, a high-frequency electronic communication signal (e.g., a differential signal) transmitted through the signal layers 11 of the circuit board 10 is received by the input pins 31. A first part of the signal is transmitted to the output pins 35 directly. A second part of the signal is transmitted to the first resistor R1 through the first via 32 and the second via 33, and is reflected back to the output pins 35 by the first resistor R1. Thus, the second part of the signal is outputted from the output pins 35 to enhance the first part of the signal, and the output of the equalizer 100 obtains one stage of compensation. A third part of the signal is transmitted to the second resistor R2 through the first via 32, the second via 33, the resistor R1, and the micro-strips 36, and is reflected back to the output pins 35 by the second resistor R2. Thus, the third part of the signal is outputted from the output pins 35 to further enhance the first part of the signal, and the output of the equalizer 100 is given a second stage of compensation. In this way, transmission losses of the signal can be effectively compensated.

Figure 3:
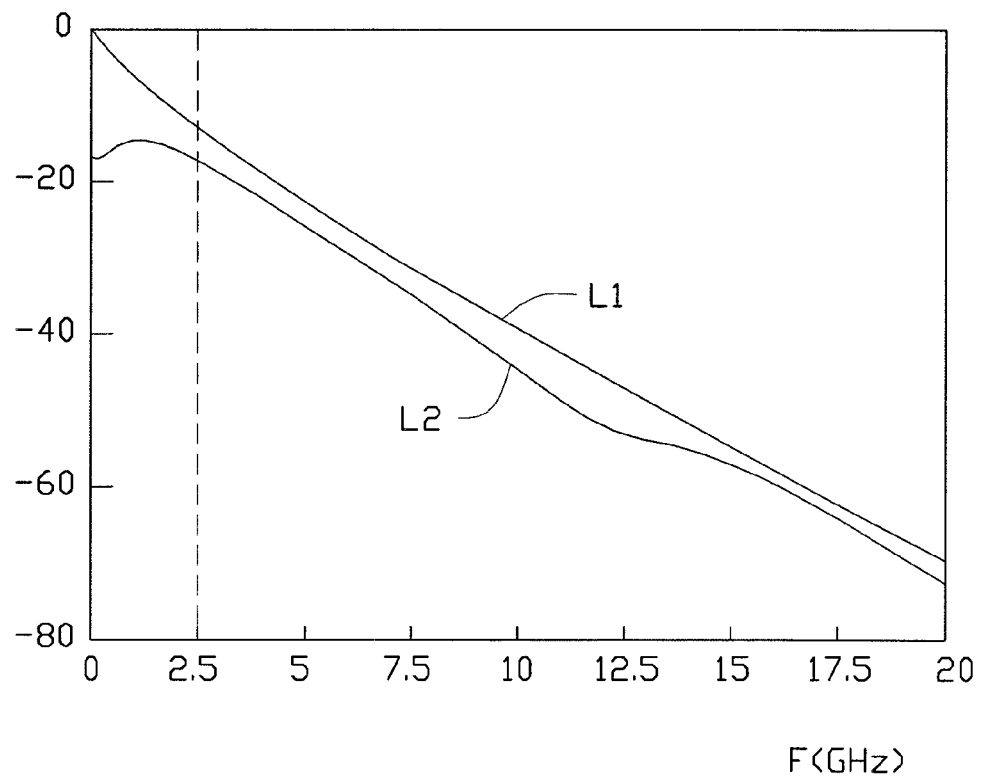
FIG. 3 is a diagram comparing a wave shape of a signal that has not been processed by the equalizer shown in FIG. 1 and a wave shape of the signal that has been processed by the equalizer shown in FIG. 1.

FIG. 3 is a diagram comparing a wave shape of a signal (e.g., a high-frequency electronic communication signal) that has not been processed by the equalizer 100 and a wave shape of the signal that has been processed by the equalizer 100. The curve L1 shows the wave shape of the signal that has not been processed by the equalizer 100, and the curve L2 shows the wave shape of the signal that has been processed by the equalizer 100. The equalizer 100 provides adequate compensation for high-frequency parts of electronic communication signals.

Figure 4:
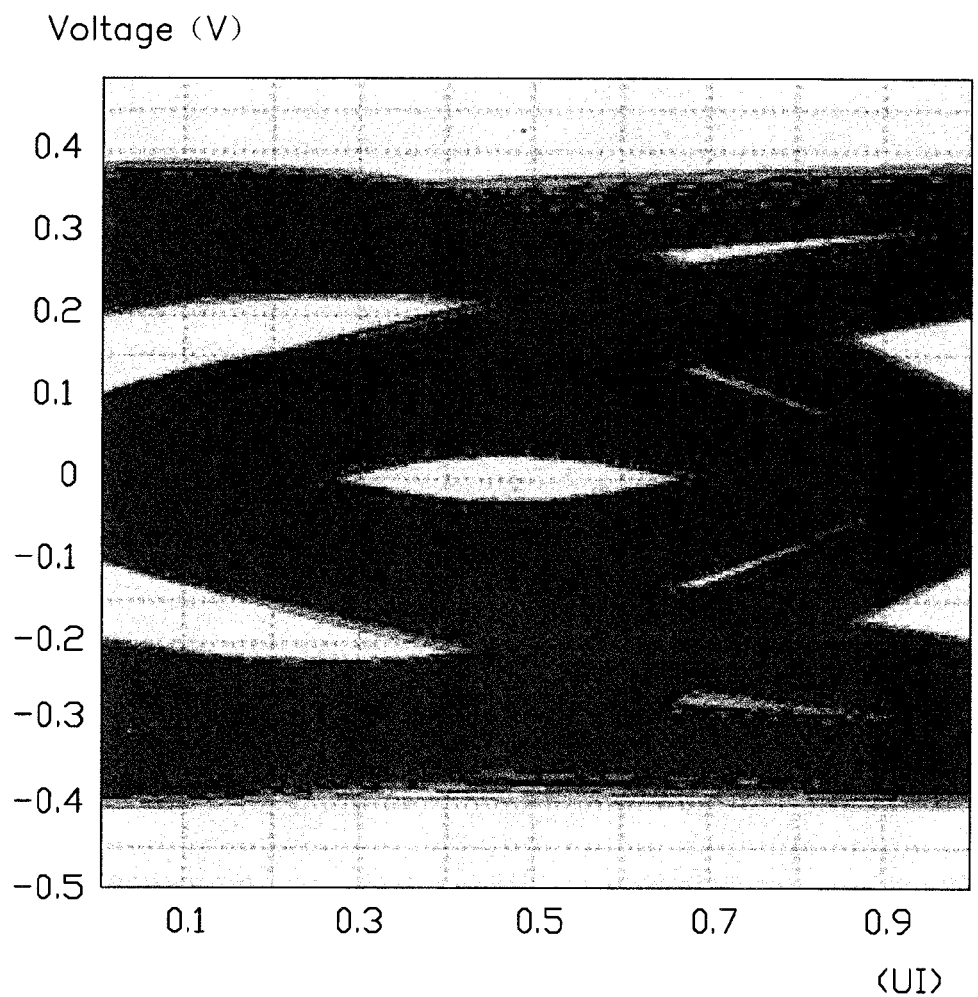
FIG. 4 is an eye pattern of the signal that has not been processed by the equalizer shown in FIG. 1 and has the wave shape shown in FIG. 3.
Figure 5:
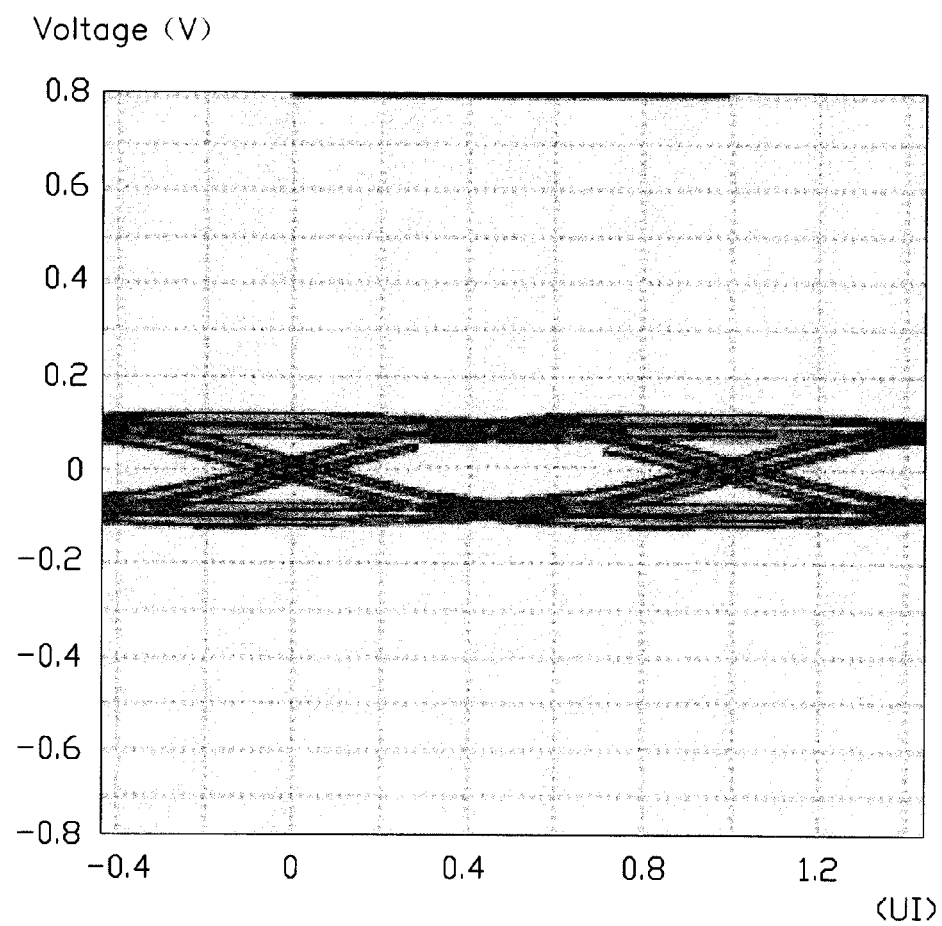
FIG. 5 is an eye pattern of the signal that has been processed by the equalizer shown in FIG. 1 and has the wave shape shown in FIG. 3.

FIG. 4 is an eye pattern of the above-described signal that has not been processed by the equalizer 100, and FIG. 5 is an eye pattern of the above-described signal that has been processed by the equalizer 100. In this embodiment, a resistance of the first resistor R1 is about 100 ohms, and a resistance of the second resistor R2 is about 10 ohms. The eye of the signal that has not been processed by the equalizer 100 has greater undulations than the eye of the signal that has been processed by the equalizer 100, and has less height than the eye pattern of the signal that has been processed by the equalizer 100. Communication quality of the signal that has been processed by the equalizer 100 is better than communication quality of the signal that has not been processed by the equalizer 100. Therefore, the equalizer 100 can significantly improve electronic communication quality.

As detailed above, when electronic communication signals pass through the equalizer 100, the equalizer 100 provides two stages of compensation to the electronic communication signals. Compared with typical equalizers, the equalizer 100 provides more compensation for the electronic communication signals. In other embodiments, the equalizer 100 can include more vias and resistors electrically connected in series, and each electronic communication signal passing through the equalizer 100 can be processed more than twice according to the aforementioned method.

Figure 6:
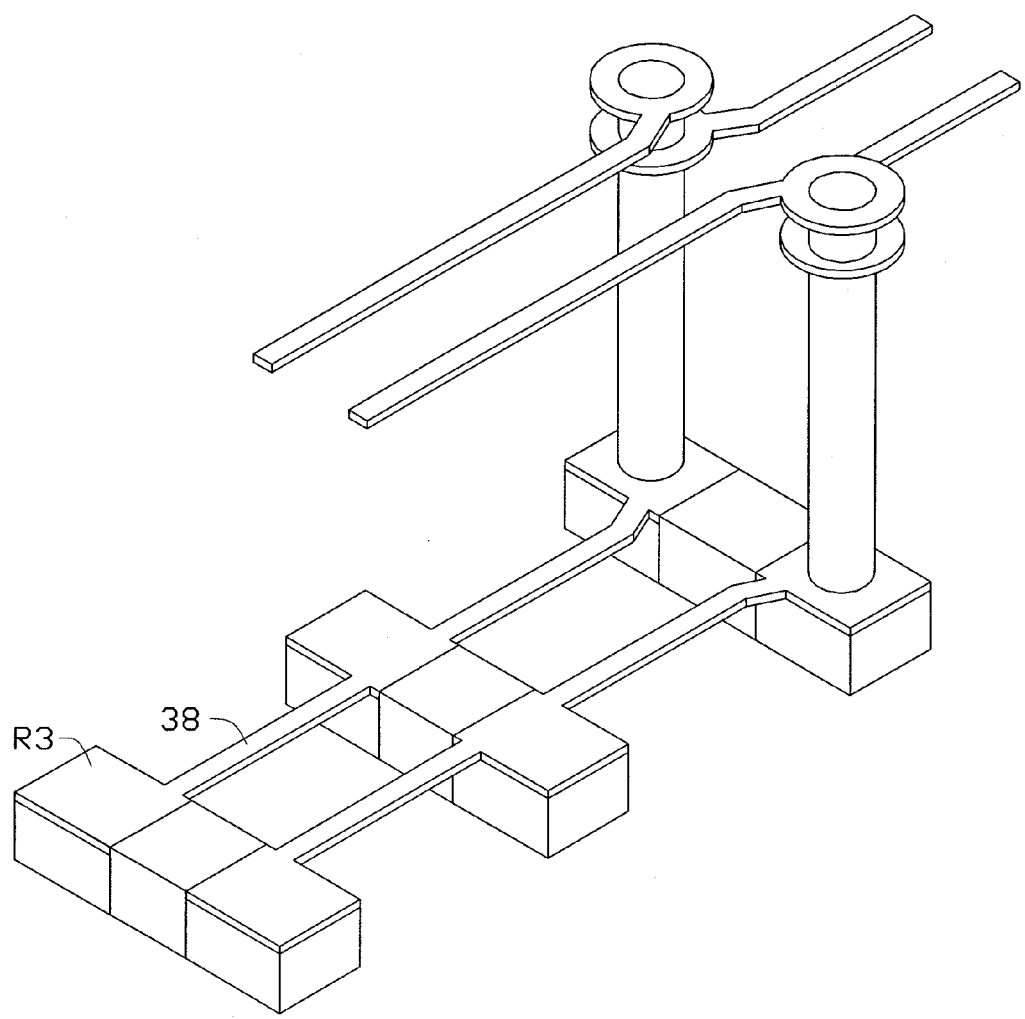
FIG. 6 is a schematic view of an equalizer, according to another exemplary embodiment.

Referring to FIG. 6, compared with the compensation module 30 in FIG. 2, another embodiment of a compensation module further includes a third resistor R3 and another pair of micro-strips 38. The pair of micro-strips 38 are connected between the second resistor and the third resistor R3. The third resistor R3 is also arranged on the outer surface of the bottom layer of the circuit board. As a result, an output of an equalizer with the compensation module is given a third stage of compensation.

It is to be further understood that even though numerous characteristics and advantages of the present embodiments have been set forth in the foregoing description, together with details of structures and functions of various embodiments, the disclosure is illustrative only, and changes may be made in detail, especially in matters of arrangement of parts within the principles of the present invention to the full extent indicated by the broad general meaning of the terms in which the appended claims are expressed.

What is claimed is:

1. An equalizer for compensating transmission loss of electronic communication signals, comprising:
   a circuit board configured to transmit the electronic communication signals; and
   a compensation module mounted in and electrically connected to the circuit board;
   wherein the compensation module comprises a pair of input pins, a pair of output pins, a first via, a second via, a first resistor, a second resistor, and a first pair of micro-strips; the first and second vias extend through the circuit board, the input pins are arranged on a top layer of the circuit board, the output pins are arranged on a middle layer of the circuit board, the first and second resistors and the pair of micro-strips are arranged on a bottom layer of the circuit board;
   wherein the first and second vias are electrically connected to the top layer of the circuit board through first and second pads respectively, the first and second vias are electrically connected to the middle layer of the circuit board through third and fourth pads respectively, the first and second vias are electrically connected to the bottom layer of the circuit board through fifth and sixth pads respectively;
   wherein the input pins are electrically connected to the first and second pads respectively, the pair of output pins are electrically connected to the third and fourth pads respectively, first ends of the first pair of micro-strips are electrically connected to the fifth and sixth pads respectively, the fifth and sixth pads are electrically connected to two terminals of the first resistor respectively, second ends of the first pair of micro-strips are electrically connected to two terminals of the second resistor; and
   wherein when an electronic communication signal transmitted by the circuit board is received by the input pins, a first part of the electronic communication signal is directly outputted from the output pins, a second part of the electronic communication signal is reflected by the first resistor and transmitted back to the output pins to be outputted, and a third part of the electronic communication signal is reflected by the second resistor and transmitted back to the output pins to be outputted.

2. The equalizer of claim 1, further comprising a third resistor and a second pair of micro-strips, wherein the second pair of micro strips are connected between the second and third resistors, the third resistor is arranged on the bottom layer of the circuit board.

3. The equalizer of claim 1, wherein the pair of input pins are substantially planar sheets.

4. The equalizer of claim 3, wherein the pair of input pins are arranged on an outer surface of the top layer.

5. The equalizer of claim 1, wherein the pair of output pins are substantially planar sheets.

6. The equalizer of claim 5, wherein the pair of output pins are arranged on a surface of the middle layer.

* * * * *